United States Patent [19]

Zhang

[11] Patent Number: 5,521,397
[45] Date of Patent: May 28, 1996

[54] OPTICAL DEVICE HAVING QUANTUM WELL STRUCTURE AND BARRIER LAYERS

[75] Inventor: Xiong Zhang, Tokyo, Japan

[73] Assignee: Olympus Optical Co., Ltd., Tokyo, Japan

[21] Appl. No.: 104,378

[22] Filed: Aug. 9, 1993

[30] Foreign Application Priority Data

Aug. 25, 1992 [JP] Japan ................................ 4-225770
Dec. 8, 1992 [JP] Japan ................................ 4-328155

[51] Int. Cl.$^6$ ................... H01L 29/06; H01L 33/00; H01L 31/0328
[52] U.S. Cl. ................... 257/17; 257/18; 257/21; 257/96; 257/22
[58] Field of Search ................... 257/14, 17, 18, 257/21, 94, 96, 101, 19, 22; 372/43, 45, 46

[56] References Cited

U.S. PATENT DOCUMENTS

| | | | |
|---|---|---|---|
| 4,616,241 | 10/1986 | Biefeld et al. | 257/18 |
| 4,825,264 | 4/1989 | Inata et al. | 257/25 |
| 4,952,792 | 8/1990 | Caridi | 257/18 |
| 4,984,242 | 1/1991 | Scifres et al. | 257/18 |
| 5,048,036 | 9/1991 | Scifres et al. | 257/190 |
| 5,057,880 | 10/1991 | Eshita et al. | 257/18 |
| 5,068,867 | 11/1991 | Hasenberg et al. | 257/18 |
| 5,132,981 | 7/1992 | Uomi et al. | 257/21 |
| 5,155,738 | 10/1992 | Ijichi et al. | 257/18 |
| 5,210,428 | 5/1993 | Goossen | 257/22 |
| 5,253,264 | 10/1993 | Suzuki et al. | 372/46 |
| 5,276,698 | 1/1994 | Yoshida et al. | 372/45 |

FOREIGN PATENT DOCUMENTS

| | | | |
|---|---|---|---|
| 61-152081 | 7/1986 | Japan | 257/18 |
| 3-44987 | 2/1991 | Japan | 257/18 |
| 4-43681 | 2/1992 | Japan | 257/18 |

OTHER PUBLICATIONS

Matthews et al., "Defects in epitaxial multilayers", Journal of Crystal Growth 27, 1974, pp. 118–125.

Thomas P. Pearsall, "Strained–Layer Superlattices: Physics", Semiconductors and Semimetals, vol. 32, 1990, Academic Press, San Diego, CA, U.S.A.

Appl. Phys. Lett. 60 (25), Jun. 22, 1992, 1992, American Institute of Physics, Critical Layer Thickness on (111) B–Oriented InGaAs/GaAs Heteroepitaxy, T. Anan et al, pp. 3159–3161.

"Observation of room–temperature blue shift and bistability in a strained InGaAs–GaAs (111) self–electro–optic effect device", Appl. Phys. Lett. 56(8), 10 Feb. 1990, pp. 715–717, Goossen et al.

Primary Examiner—Rolf Hille
Assistant Examiner—Minhloan Tran
Attorney, Agent, or Firm—Frishauf, Holtz, Goodman, Langer & Chick

[57] ABSTRACT

Layers each consisting of one of two types of compound semiconductors A and B different from each other in a lattice constant a and an energy band gap Eg (a(A)>a(B), Eg(A)<Eg(B)) are stacked in a [111] direction on a compound semiconductor substrate whose major surface is a surface. When each layer consisting of the compound semiconductor A serves as a well layer and each layer consisting of the compound semiconductor B serves as a barrier layer, the barrier layer is formed to have a thickness larger than the critical film thickness of strain relaxation in that barrier layer and is thereby so strained as to be pulled in a direction parallel to a crystal growth surface. The well layer is so strained as to be compressed in the direction parallel to the crystal growth surface owing to partial relaxation of a strain confined in the barrier layer. This can achieve as large an optical bistable effect as possible while maintaining the light blue-shift absorption characteristic.

16 Claims, 8 Drawing Sheets

OPTICAL DEVICE HAVING QUANTUM WELL STRUCTURE AND BARRIER LAYERS

BACKGROUND OF THE INVENTION

1. Field of the Invention

The present invention relates to a nonlinear optical device essential to an optical information processing system for controlling light by using optical or electrical signals and, more particularly, to a semiconductor quantum well optical device using a strained quantum well or superlattice structure of a compound semiconductor.

2. Description of the Related Art

To realize high-efficiency, high-speed nonlinear optical devices, a semiconductor quantum well optical device making use of a semiconductor quantum well or a superlattice structure has been researched and developed in recent years. The semiconductor quantum well or the superlattice structure has a large nonlinear constant and good electrical properties as compared with other nonlinear materials (e.g., organic nonlinear materials). Therefore, this structure enables to further enhance the optical nonlinearity by introducing some electrical means or to use an electrical device and a nonlinear optical device at the same time.

Recently, a strained quantum well or a superlattice structure has been proposed, which is formed along a [111] direction by using two types of compound semiconductors having different lattice constants, unlike conventional quantum well nonlinear devices formed along a [001] direction. In this structure, a high internal electric field produced by a piezoelectric effect caused by a lattice mismatch is present (for example, when the lattice mismatch is 1%, the strength of this internal electric field is about $10^5$ v/cm). When an external electric field is applied to this quantum well structure, therefore, a specific quantum confined stark effect (QCSE), e.g., a blue shift of an absorption peak due to the applied electric field is observed upon incident of light.

Figure 1:
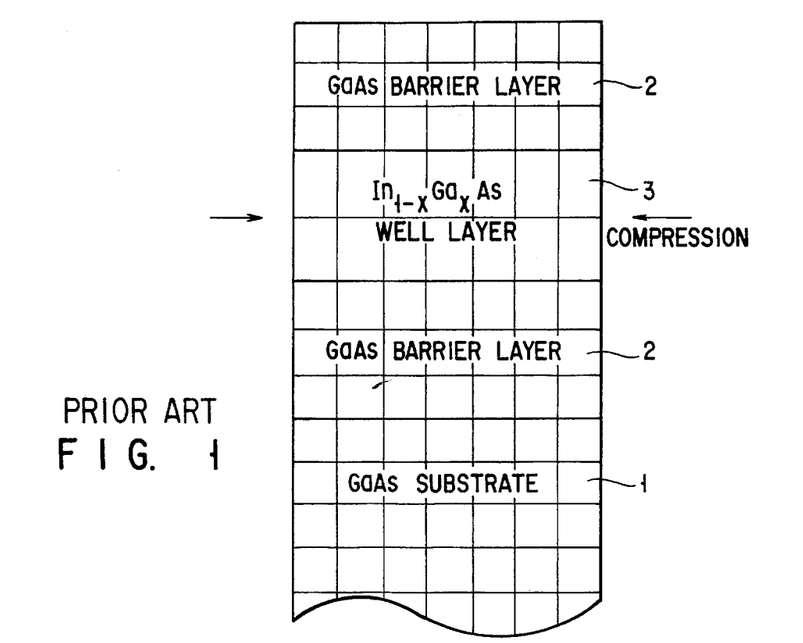
FIG. 1 is a view showing a conventional strained quantum well structure.

FIG. 1 shows a strained quantum well structure in which GaAs barrier layers 2 with no strain and an $In_{1-x}Ga_xAs$ well layer 3 with a compression strain are alternately formed on the (111) surface of a GaAs substrate 1 (K. W. Goosen, et al., Appl. Phys. Lett. 56(8), 715 (1990)). In this strained quantum well structure, the magnitude of a strain confined in the well layer 3, i.e., the magnitude of an internal electric field produced by the strain and the energy band offset (the depth of a quantum well) between the well layer 3 and the barrier layers 2 are determined by the composition of In contained in the well layer 3.

In conventionally proposed strained quantum well structures in a [111] direction as shown in FIG. 1, however, the strain produced by a lattice mismatch and the internal electric field produced by a piezoelectric effect caused by a lattice deformation are localized only in the well layer 3. For this reason, a large internal electric field exists even for a slight lattice mismatch. Since the magnitude of the internal electric field and the band offset are determined completely by the composition of In in the well layer 3, it is impossible to change the internal electric field and the band offset independently of each other.

In addition, according to the deformation potential theory, a direct transition type semiconductor increases its energy band gap when it is subjected to a compression strain. This consequently decreases the magnitude (band offset) of discontinuity at the ends of bands in the well layer 3 and the barrier layers 2, i.e., the depth of a quantum well. In this case, if the band offset, i.e., the composition of In is increased in order to keep the quantum confined effect, the strain increases accordingly, and the internal electric field also tends to increase to be larger than is necessary. That is, since both the internal electric field and the band offset strongly depend on the magnitude of a strain, it is impossible to change these factors independently of each other.

For the reasons described above, if the quantum well structure is applied to, for example, a SEED (Self Electric Optic Effect Device), which is the most representative nonlinear optical device, and no external electric field is applied to the quantum well, light absorption by excitonic transition becomes much weaker than that of a quantum well structure with no internal electric field. Therefore, modulation of light absorption derived from changes in (the direction and the magnitude of) the external electric field or optical bistability becomes smaller than those of regular quantum well devices.

SUMMARY OF THE INVENTION

The present invention has been made in consideration of the above situation and has as its object to provide a semiconductor quantum well device with a strained quantum well structure which has as large an optical bistable effect as possible while maintaining the blue-shift light absorption characteristic.

The above object is achieved by the first and second aspects of the present invention to be presented below.

The first aspect of the present invention provides a semiconductor quantum well optical device in which layers each consisting of one of two types of compound semiconductors A and B different from each other in a lattice constant a and an energy band gap Eg (a(A)>a(B), Eg(A)<Eg(B)) are stacked on a compound semiconductor substrate whose major surface is a (111) surface, thereby forming a strained quantum well in which layers consisting of the compound semiconductor A serve as well layers and layer consisting of the compound semiconductor B serve as barrier layers, wherein each barrier layer is formed to have a thickness (twice to four times) larger than the critical film thickness of strain relaxation in the barrier layer (in accordance with the degree of a lattice mismatch between the well layer and the barrier layer) and is thereby so strained as to be tensed in a direction parallel to a crystal growth surface, and each well layer is so strained as to be compressed in the direction parallel to the crystal growth surface by a partial relaxation (8% or less) of the strain confined in the barrier layer.

The second aspect of the present invention provides a semiconductor quantum well optical device in which layers consisting of a compound semiconductor C with a smaller lattice constant than that of a material constituting a compound semiconductor substrate whose major (111) surface is a surface and layers consisting of a compound semiconductor D with a lattice constant larger than or substantially equal to that of the material constituting the compound semiconductor substrate are stacked on the compound semiconductor substrate, thereby forming a strained quantum well in which layers consisting of the compound semiconductor C serve as well layers and layers consisting of the compound semiconductor D serve as barrier layers, wherein each well layer is formed to have a thickness smaller than the critical film thickness of strain relaxation in the well layer so that a tensile strain in a direction parallel to a crystal growth surface is confined perfectly, and, if the lattice constant of each barrier layer is larger than that of the substrate, the barrier layer is formed to have a thickness smaller than the critical film thickness of strain relaxation in the barrier layer so that a compression strain in the direction parallel to the crystal growth surface is confined perfectly.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

According to the first aspect of the present invention, since the thickness of the semiconductor B serving as a barrier layer is about twice to four times as large as the critical film thickness of strain relaxation of the semiconductor B, a tensile strain confined in the semiconductor B is partially relaxed by occurrence of misfit dislocations. As a result, the semiconductor A serving as a well layer is also compressed in a direction parallel to a crystal growth surface. The magnitude of a compression strain in this well layer can be freely controlled by setting the relaxation rate of the tensile strain in the barrier layer by adjusting the thickness and lattice constant differences. That is, an internal electric field in the well layer which has a decisive effect on the optical and electrical characteristics of a quantum well can be controlled as needed.

To maintain the quantum confined effect of a strained quantum well, it is of course necessary to keep the sharpness of a hetero interface in the strained quantum structure. Three-dimensional (island-like) growth, however, easily occurs owing to relaxation of a strain, and this may degrade the sharpness of the hetero interface. Although a maximum allowable strain relaxation rate (which corresponds to a maximum internal electric field) depends on a practical combination of substances and the crystal growth conditions (e.g., the temperature, the pressure, the composition of mixed crystal, the layer thickness, and the direction), it is about 8% in a GaAs/GaAsP (A=GaAs, B=GaAsP, GaAs (001) substrate) strained quantum well structure. That is, since the strain can be distributed to the barrier layers, the magnitudes of the compression strain and the internal electric field in the well layer can be decreased to be about $\frac{1}{10}$ or less of those in conventional quantum well structures, in which only well layers are strained, for the same lattice mismatch.

In addition, the band offset of the quantum well can be changed by adjusting the mixed crystal ratio (composition) and the layer thickness of the barrier layer B without changing the magnitude of the strain (internal electric field) in the well layer A. That is, the ability to control the strain (internal electric field) and the band offset independently of each other as needed can be realized in the strained quantum well structure proposed by the present invention. Note that the magnitude and the direction of an internal electric field produced by a piezoelectric effect depend on the magnitude and the direction of a strain.

According to the second aspect of the present invention, the magnitude of a tensile strain, i.e., an internal electric field in a well layer is determined by the degree of a lattice mismatch between the well layer and the barrier layer. For this reason, as in the first aspect of the present invention, it is possible to perform independent control of the strain (internal electric field) and the band offset, which cannot be performed in conventional quantum well structures.

Examples of the present invention will be described below with reference to the accompanying drawings. First, quantum well structures (Examples 1 to 3) which can overcome the drawbacks of conventional strained quantum well structures at once will be described first. Subsequently, novel optical devices (Examples 4 to 10) based on these new quantum well structures will be described.

In the present invention, a zinc-blende type compound semiconductor can be used as the material of a compound semiconductor substrate. The two types of compound semiconductors A and B different in a lattice constant a and an energy band gap Eg can be a zinc-blend type compound semiconductor.

Example 1

Figure 2:
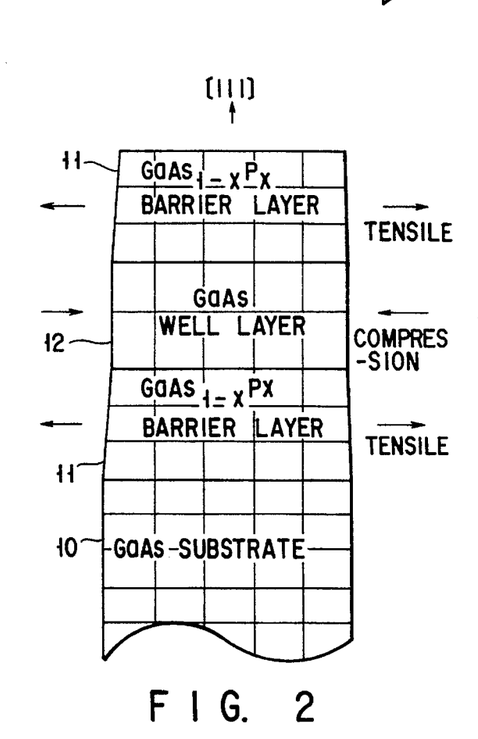
FIG. 2 is a view showing a strained quantum well structure in a [111] direction according to Example 1.

FIG. 2 shows a strained quantum well structure in a [111] direction according to Example 1 of the present invention. Referring to FIG. 2, $GaAs_{1-x}P_x$ layers 11 with a lattice constant smaller than that of GaAs and an energy band gap larger than that of GaAs and a GaAs layer 12 are alternately stacked on a (111) GaAs substrate 10. The film thickness of $GaAs_{1-x}P_x$ as the barrier layer 11 is set to be (twice to four times) larger than the critical film thickness of strain relaxation in that layer. A tensile strain, therefore, is in part relaxed by misfit dislocations, and consequently GaAs as the well layer 12 is slightly compressed in a direction parallel to that layer. The magnitude of this compression strain is determined by the ratio at which the tensile strain confined in the $GaAs_{1-x}P_x$ barrier layers 11 is relaxed.

In the strained quantum well structure, the relaxation of a strain brings about misfit dislocations in the hetero interface of the quantum well, and this may adversely affect the electrical and optical characteristics of the quantum well. That is, there are limitations on the relaxation of a strain. It is considered that the ratio (maximum strain relaxation rate) at which a maximum allowable strain is relaxed depends on the type of a substance. The present inventors have experimentally found that the maximum strain relaxation rate of GaAs/GaAsP used in Example 1 is about 8% in growth in a [001] direction (X. Zhang. Ph.D. Thesis, The University of Tokyo, 1992). This value is approximately ten times as large as the maximum strain relaxation rate of any strained substance reported so far.

When growth is performed in a [111] direction, the maximum allowable strain rate does not, of course, always equal to that in the [001] direction. However, it can be reckoned that the $GaAs/GaAs_{1-x}P_x$ strained quantum structure, which is formed in the [111] direction on the GaAs substrate 10, and in which the $GaAs_{1-x}P_x$ barrier layers 11 are strained with respect to the center, is relatively resistant against the relaxation of a strain.

Taking advantage of this characteristic, Example 1 provides a $GaAs/GaAs_{1-x}P_x$ strained quantum well in which a strain, i.e., an internal electric field and a band offset in the well can be freely controlled independently of each other over a predetermined range. The principle of Example 1 is as follows.

The magnitude of a compression strain in the GaAs well layer 12 is determined by the ratio at which a tensile strain of the $GaAs_{1-x}P_x$ barrier layer 11 is relaxed. The latter factor depends on the film thickness of $GaAs_{1-x}P_x$ and the composition of P. On the other hand, the band offset between GaAs and $GaAs_{1-x}P_x$ is determined substantially by the composition of P alone. Therefore, even if the composition of P, i.e., the band offset is considerably large, the tensile strain relaxation rate of the $GaAs_{1-x}P_x$ barrier layer 11 can be reduced by appropriately decreasing the film thickness of $GaAs_{1-x}P_x$. For this reason, the magnitude of the strain in the GaAs well layer 12 or the magnitude of the internal electric field in the well remains almost unchanged. Conversely, a necessary strain (internal electric field) can be obtained by properly increasing or decreasing the film thickness of $GaAs_{1-x}P_x$ without changing the band offset (P composition). That is, it is possible to change the internal electric field produced by the strain and the band offset independently of each other in the $GaAs/GaAs_{1-x}P_x$ strained quantum well structure formed on the GaAs substrate 10 described above.

Note that the characteristic wavelength of optical transition in the $GaAs/GaAs_{1-x}P_x$ strained quantum well structure (in which GaAs serves as the well layer) of Example 1 is approximately 0.8 μm at room temperature, which is a shorter wavelength than 1.2 to 1.5 μm of a conventional $In_{1-x}Ga_xAs/GaAs$ strained quantum well structure (in which $In_{1-x}Ga_xAs$ serves as the well layer).

According to Example 1 as described above, the strained quantum well structure is formed by alternately stacking the $GaAs_{1-x}P_x$ barrier layers 11 and the GaAs well layer 12 on the GaAs substrate 10 whose major surface is a (111) surface. In addition, the barrier layers 11 are formed to have a thickness larger than the critical film thickness of strain relaxation so that a tensile strain in a direction parallel to a crystal growth surface is in part relaxed, thereby giving a compression strain in the direction parallel to the crystal growth surface to the well layer 12. Therefore, the internal electric field and the band offset can be controlled independently of each other. This makes it possible to realize a large optical bistable effect which cannot be obtained by any conventional structure while maintaining the blue-shift light absorption characteristic.

Example 2

Figure 3:
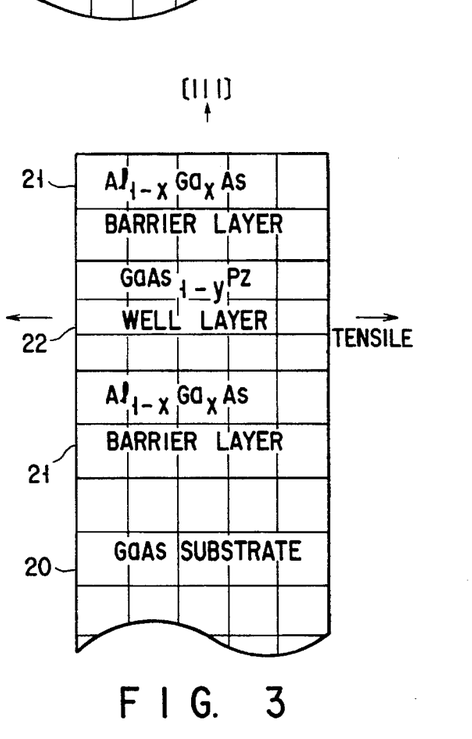
FIG. 3 is a view showing a strained quantum well structure in a [111] direction according to Example 2.

FIG. 3 shows a strained quantum well structure in a [111] direction according to Example 2 of the present invention. Referring to FIG. 3, $Al_{1-x}Ga_xAs$ layers 21 with a lattice constant substantially equal to that of GaAs and a $GaAs_{1-y}P_y$ layer 22 with a lattice constant smaller than that of GaAs are alternately stacked on the (111) surface of a GaAs substrate 20. In this Example 2, unlike in Example 1, the film thickness of $GaAs_{1-y}P_y$ is set to be smaller than the critical film thickness of strain relaxation in that layer. Therefore, a tensile strain is perfectly confined in $GaAs_{1-y}P_y$, so a state with no strain relaxation takes place. In this structure, since the composition of Al contained in $Al_{1-x}Ga_xAs$ and the composition of P contained in $GaAs_{1-y}P_y$ are controlled such that the band gap of $GaAs_{1-y}P_y$ is kept smaller than that of $Al_{1-x}Ga_xAs$, the $GaAs_{1-y}P_y$ layer 22 with a tensile strain serves as a well layer, and the $Al_{1-x}Ga_xAs$ layers 21 serve as barrier layers.

In such a strained quantum well structure, it is also possible to control a strain or an internal electric field and a band offset in the quantum well freely and independently of each other. The principle is as follows.

The magnitude of a tensile strain, i.e., an internal electric field in the $GaAs_{1-y}P_y$ well layer 22 is determined by the degree of a lattice mismatch between $GaAs_{1-y}P_y$ and $Al_{1-x}Ga_xAs$. The latter factor is simply determined by the composition y of P in $GaAs_{1-y}P_y$ because the lattice constant of $Al_{1-x}Ga_xAs$ hardly depends on the value of x. A necessary band offset between $GaAs_{1-y}P_y$ and $Al_{1-x}Ga_xAs$, on the other hand, can be obtained by increasing or decreasing the composition of Al in $Al_{1-x}Ga_xAs$ with respect to a certain strain (internal electric field). That is, in the $GaAs_{1-y}P_y/Al_{1-x}Ga_xAs$ strained quantum well structure formed on the GaAs substrate 20 described above, free and independent control of the internal electric field and the band offset can be realized even in the strain relaxation-free state.

In addition, since $GaAs_{1-y}P_y$ serves as the well layer 22, the characteristic wavelength of optical transition in the quantum well structure is shorter than that in Example 1, i.e., it is possible to set the characteristic wavelength within a visible light region of 0.4 to 0.8 μm at room temperature.

Example 3

Figure 4:
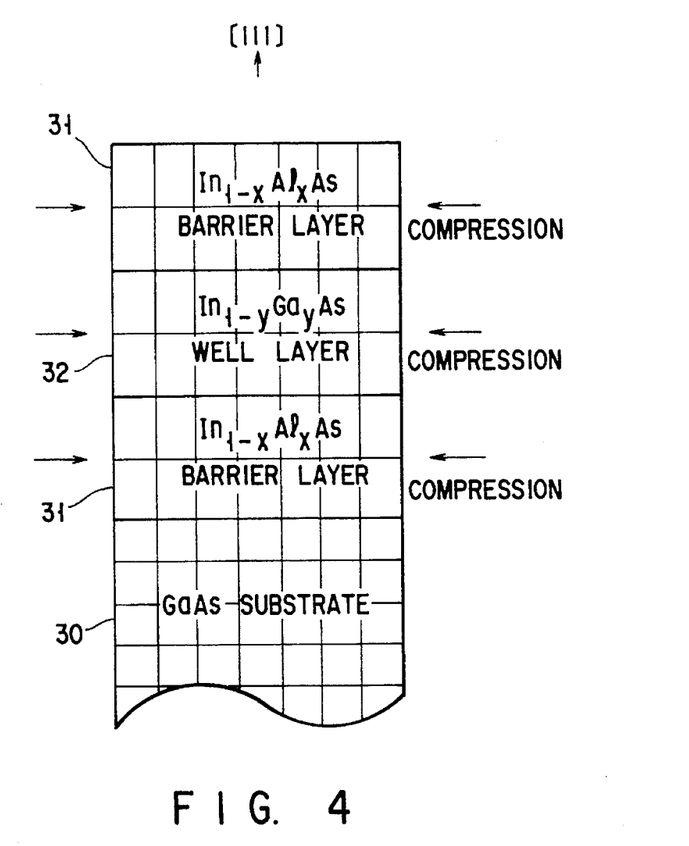
FIG. 4 is a view showing a strained quantum well structure in a [111] direction according to Example 3.

FIG. 4 shows a strained quantum well structure in a [111] direction according to Example 3 of the present invention. Referring to FIG. 4, $In_{1-x}Al_xAs$ layers 31 and an $In_{1-y}Ga_yAs$ layer 32, both of which have lattice constants larger than that of GaAs and band gaps smaller than that of GaAs, are alternately stacked on the (111) surface of a GaAs substrate 30, thereby forming a quantum well structure. In Example 3, like in Example 2, since the film thicknesses of $In_{1-x}Al_xAs$ and $In_{1-y}Ga_yAs$ are smaller than their respective strain relaxation critical film thicknesses, a state with no relaxation of a compression strain is obtained. In addition, the composition x of Al in $In_{1-x}Al_xAs$ and the composition y of Ga in $In_{1-y}Ga_yAs$ are controlled so that the band gap of $In_{1-y}Ga_yAs$ is kept smaller than the band gap of $In_{1-x}Al_xAs$. Therefore, the $In_{1-x}Al_xAs$ layers 31 having a compression strain serve as barrier layers, and the $In_{1-y}Ga_yAs$ layer 32 serves as a well layer.

Since the $In_{1-y}Ga_yAs$ well layer 32 is completely strained, the lattice constant of the layer 32 in the lateral direction is equal to the lattice constant of GaAs. Therefore, the magnitude of a compression strain confined in the $In_{1-y}Ga_yAs$ well layer 32, i.e., the magnitude of an internal electric field is determined by a lattice mismatch between $In_{1-y}Ga_yAs$ and GaAs, i.e., the composition y. On the other hand, the band offset between $In_{1-y}Ga_yAs$ and $In_{1-x}Al_xAs$ can be controlled by changing the composition x of Al in $In_{1-x}Al_xAs$ with respect to a certain value of y. That is, the $In_{1-y}Ga_yAs/In_{1-x}Al_xAs$ strained quantum well structure formed in the [111] direction described above also makes independent and free control of the strain (internal electric field) and the band offset possible, which cannot be realized by conventional quantum well structures, in the strain relaxation-free state.

Note that since $In_{1-y}Ga_yAs$ serves as the well layer 32, the characteristic wavelength of optical transition in the above quantum structure is approximately 1.2 to 1.5 μm, covering the wavelength range of conventional quantum well structures.

Example 4

Figure 5:
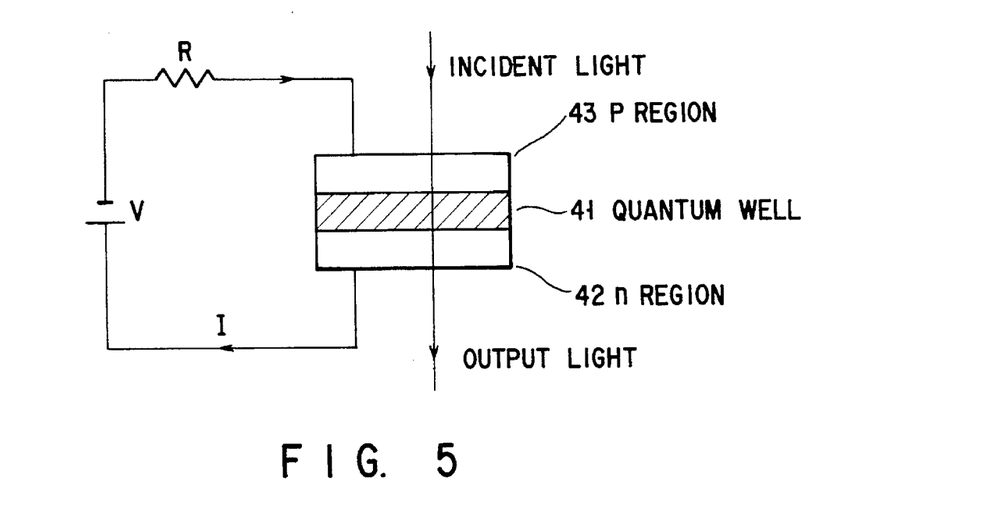
FIG. 5 is a view showing the arrangement of an optical bistable device according to Example 4, which includes a strained quantum well structure.

FIG. 5 shows the arrangement of an optical bistable device according to Example 4 of the present invention, which includes one of the strained quantum well structures of Examples 1 to 3. This device has a hetero structure in which a quantum well structure 41, as one of the quantum well structures according to Examples 1 to 3, is sandwiched by an n-type compound semiconductor region 42 and a p-type compound semiconductor region 43. More specifically, this structure is formed by forming the n-type cladding layer (n-type region) 42 on an n-type GaAs substrate, the quantum well structure 41 on top of the layer 42, and the p-type cladding layer (p-type region) 43 on top of the quantum well structure 41. A power source is connected between the n- and p-type regions 42 and 43 via a load resistor R.

Although the three types of strained quantum structures are different from one another in the mechanism of a strain and the characteristic wavelength of optical transition as described above, an internal electric field (to be referred to as Ei hereinafter) that can be controlled independently of a band offset exists in the well layer in any of these three structures. If the barrier layer is strained, an internal electric field is also generated, of course, in the barrier layer. However, the internal electric field localized in the barrier layer has almost no influence on the electrical and optical characteristics of the quantum well structure. For this reason, focusing attention only on the internal electric field Ei present in the well layer, the operating principle of the optical device proposed by the present invention will be described below.

Figure 6A:
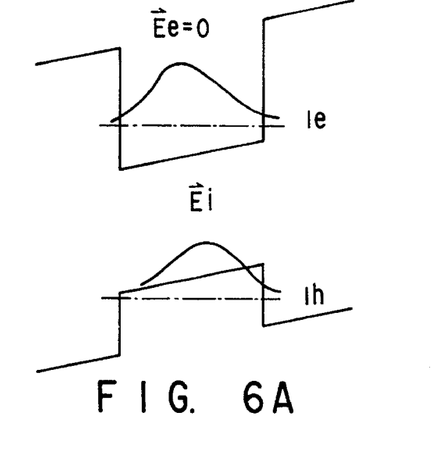
FIGS. 6A, 6B, 7A, and 7B are views showing the energy bands of the optical bistable device according to Example 4.
Figure 6B:
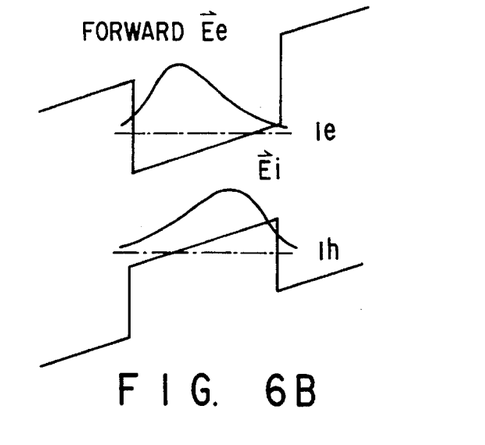
Figure 6C:
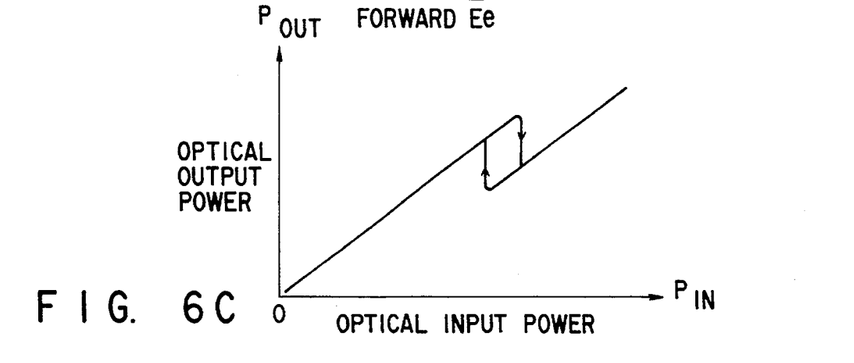
FIGS. 6C and 7C are graphs showing the operation characteristics of the optical bistable device according to Example 4.
Figure 7A:
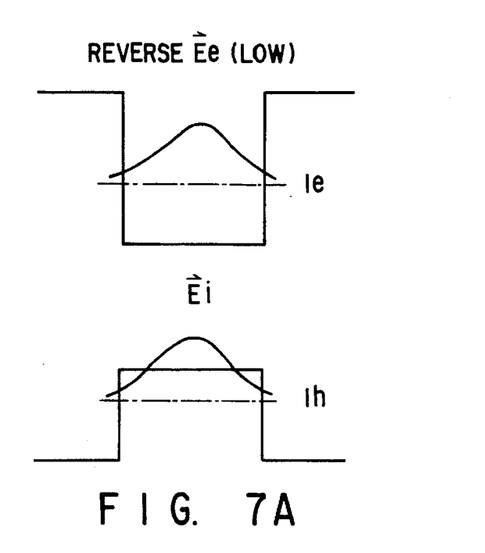
Figure 7B:
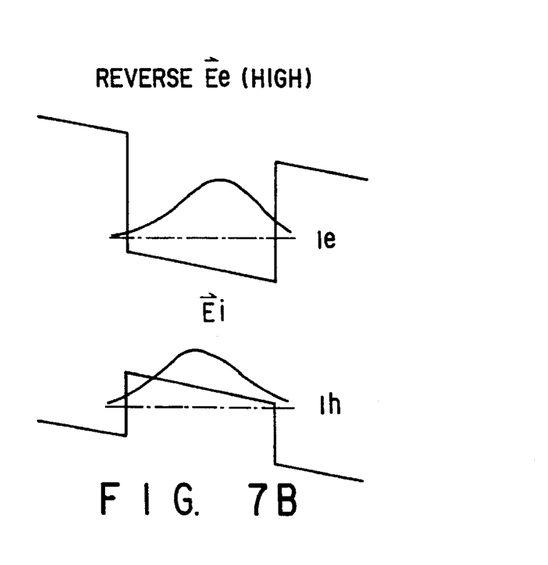
Figure 7C:
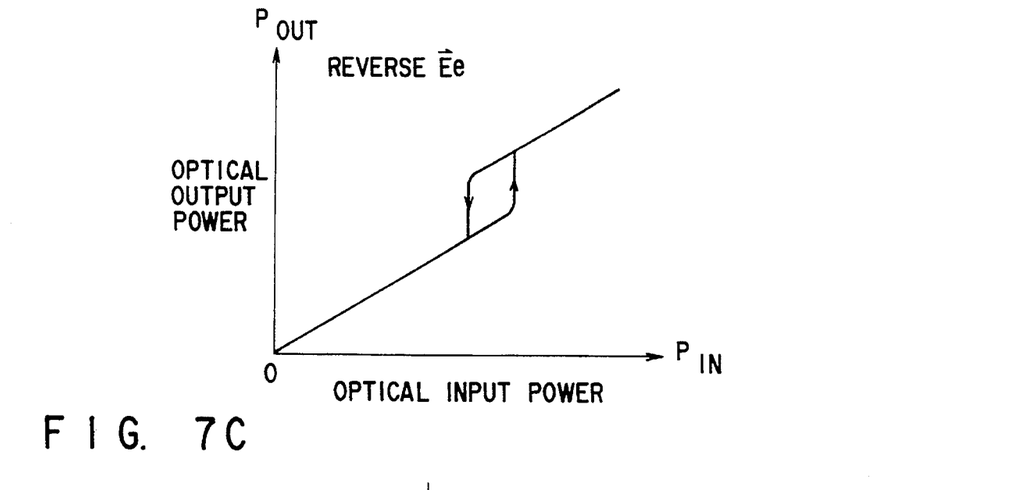

FIG. 6A is an energy band diagram when no external electric field is applied (Ee=0), and FIG. 6B is an energy band diagram when an external electric field Ee (forward bias) in the same direction as that of the internal electric field Ei is applied. FIG. 6C is a graph showing the operation characteristics of the optical bistable device when the forward bias is applied. FIG. 7A is an energy band diagram when a reverse bias (|Ee|≦|Ei|) is applied, and FIG. 7B is an energy band diagram when a reverse bias (|Ee|>|Ei|) is applied. FIG. 7C is a graph showing the operation characteristics of the optical bistable device when the reverse bias is applied.

In a quantum well structure not applied with any external electric field (to be referred to as Ee hereinafter), an internal electric field produced by a strain exists. As shown in FIG. 6A, therefore, the absolute values of wave functions of the conduction band and the valence band are asymmetrical about the center of the well. Assume that the wavelength of incident light agrees with the excitonic transition peak wavelength (energy) at the time no external electric field is applied. In this case, when Ee (forward bias) in the same direction as that of Ei is applied to the quantum well structure, as shown in FIG. 6B, the wave functions become further asymmetrical about the center of the well. At the same time, the electron level (1e) of the conduction band relatively lowers, while the quantum levels (1h and 1l, only 1h is shown in FIGS. 6A and 6B) in heavy holes and light holes in the valence band relatively rise. As a result, the oscillator strengths of excitons decrease, shifting the transition peak to the low-energy side (red shift).

When the power of incident light is increased in this state, a photocurrent I increases, and consequently the voltage applied on the load resistor R drops, decreasing the forward bias electric field applied to the quantum well structure. Since the oscillator strengths of excitons increase when the forward bias reduces, the light absorption of the quantum well and the photocurrent increase. This increase in the photocurrent encourages the voltage drop across the resistor R, further decreasing the voltage applied to the quantum well. By repeating this positive feedback, the quantum well structure jumps from the high-voltage, low-absorption state to the low-voltage, high-absorption state.

FIG. 6C shows that the quantum well structure has operation characteristics as an optical bistable device when the forward bias as described above is applied. The magnitudes of the internal electric field and the band offset of the optical bistable device using the strained quantum well structure proposed by the present invention can be freely controlled as needed compared to those in conventional optical bistable devices, such as a SEED (Self Electro-Optic Effect Device). This can provide a great merit of the ability to freely adjust the absorption ratio of light in high- and low-electric field applied states.

The operating principle of the optical bistable device when Ee (reverse bias) in a direction opposite to that of Ei is applied to the quantum well structure will be described next. Suppose the wavelength (photon energy) of incident light coincides with the excitonic transition peak wavelength (energy) of Ee=−Ei. When the reverse bias Ee (e.g., |Ee|≦|Ei|) is applied to the quantum well, as shown in FIG. 7A, the wave functions become more symmetrical about the center of the well than in the case of Ee=0 (FIG. 6A). At the same time, the electron level (1e) in the conduction band relatively rises, whereas the quantum levels (1h and 1l, only 1h is shown in FIGS. 7A and 7B) in heavy holes and light holes of the valance band relatively lower. As a result, the oscillator strengths of excitons increase, shifting the transition peak to the high-energy side (blue shift).

When the power of incident light is increased in this state, the photocurrent I increases, and consequently the voltage drop in the load resistor R increases, decreasing the reverse bias applied to the quantum well. When the reverse bias reduces, the oscillator strengths of excitons and the light absorption decrease. Nevertheless, the photocurrent increases with the increase in input power. This increase in the photocurrent encourages the voltage drop across the resistor R, further decreasing the voltage applied to the quantum well. By repeating this positive feedback, the quantum well structure jumps from the high-voltage, high-absorption state to the low-voltage, low-absorption state. FIG. 7C indicates that the quantum well structure has operation characteristics as an optical bistable device when the reverse bias (|Ee|≦|Ei|) as described above is applied.

If, however, the magnitude of the reverse electric field applied to the strained quantum well structure is larger than that of the internal electric field in the well layer (|Ee|>|Ei|), as shown in FIG. 7B, the energy band of the quantum well again becomes asymmetrical about the center of the well as Ee increases. The resulting operation characteristics of the optical bistable device are similar to those obtained when the forward bias is applied (FIG. 6C). That is, the quantum well structure jumps from the high-voltage, low-absorption state to the low-voltage, high-absorption state.

As is apparent from the above description, the internal electric field present in the well layer of the strained quantum well formed in the [111] direction is the core of the optical bistable device. Using the strained quantum well structure whose internal electric field can be freely controlled, Example 4 not only brings about a large degree of freedom in designing optical bistable devices but also suggests the possibility of novel optical bistable devices having both the red-shift and blue-shift characteristics, the realization of which is impossible by conventional quantum well structures.

Example 5

Figure 8:
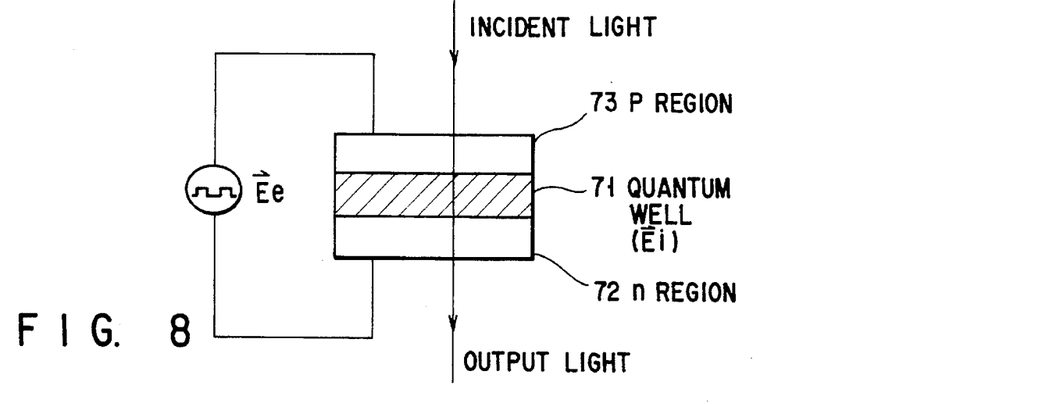
FIG. 8 is a view showing the arrangement of an optical device according to Example 5, which includes a strained quantum well.

FIG. 8 shows the arrangement of an optical device with a high extinction ratio and a high response speed according to Example 5 of the present invention, which includes one of the strained quantum well structures of Examples 1 to 3. Referring to FIG. 8, the device has a hetero structure in which a quantum well structure 71, as one of the quantum well structures according to Examples 1 to 3, is sandwiched by an n-type compound semiconductor region 72 and a p-type compound semiconductor region 73. More specifically, this structure is formed by growing the n-type cladding layer (n-type region) 72 on an n-type GaAs substrate, the quantum well 71 on top of the layer 72, and the p-type cladding layer (p-type region) 73 on top of the quantum well 71. An external electric field is applied between the n- and p-type regions 72 and 73.

Figure 9:
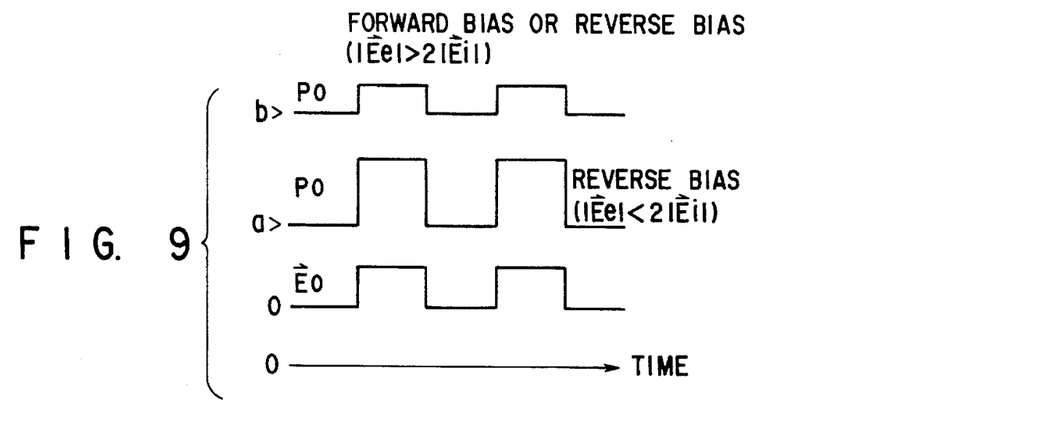
FIG. 9 is a timing chart showing an optical output power modulating operation performed by the bias electric field of the optical device according to Example 5.

In this arrangement, assume that the wavelength (photon energy) of incident light matches the excitonic transition peak wavelength (energy) when no electric field is applied (Ee=0). An internal electric field Ei produced by a piezoelectric effect exists in the well layer of the above quantum well structure, so if a reverse bias Ee (|Ee|≦2|Ei|) is applied to the quantum well, as shown in FIG. 7A, the wave functions become more symmetrical about the center of the well than when Ee=0 (FIG. 6A). At the same time, the electron level (1e) in the conduction band relatively rises, while the quantum levels (1h and 1l, only 1h is shown in the drawings) in heavy holes and light holes in the valence band relatively lower. This consequently disables the absorption of incident light by excitonic transition. That is, when the reverse bias electric field is applied, as indicated by a in FIG. 9 (in which P₀ represents optical output power), the quantum well jumps from the state with absorption to a transparent state with respect to the incident light. This can provide a light modulating device with a high extinction ratio and a high response speed derived from the bias electric field.

If, on the other hand, a forward bias or a high reverse bias (|Ee|>2|Ei|) is applied to the quantum well, as shown in FIG. 6B, the wave functions become more asymmetrical about the center of the well than in the case of Ee=0 (FIG. 6A), and at the same time the excitonic transition peak causes a red shift. Consequently, excitonic transition again causes absorption of incident light, albeit a weak one. That is, the modulating effect of the bias electric field with respect to the incident light is no longer significant as indicated by b in FIG. 9. As is apparent from the above description, the light modulating device of the present invention can stably operate over a broad range of electric fields only by increasing Ei, i.e., the magnitude of a strain (Ei=0 or Ei cannot be easily changed in conventional structures).

Example 6

Another application of the strained quantum well structure formed in the [111] direction proposed by the present invention is an optical filter whose wavelength selection range can be changed in accordance with (the direction and the magnitude of) an external bias electric field. The arrangement of an optical filter with the [111] strained quantum well structure of this type is identical with the one shown in FIG. 5.

Figure 10:
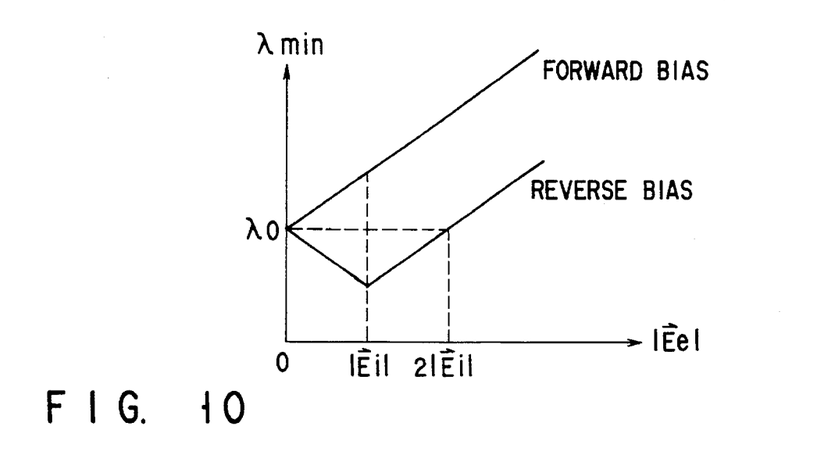
FIG. 10 is a graph showing the selectivity for a minimum transmitted wavelength by the bias electric field of an optical device according to Example 6.

Suppose the minimum wavelength of light that can pass through the above optical filter without causing any light absorption by excitonic transition with respect to incident light consisting of a large number of components having various wavelengths is λmin. When a forward bias electric field in the same direction as that of an internal electric field Ei or a reverse bias electric field Ee higher than the internal electric field is applied to the quantum well structure, as shown in FIGS. 6B and 7B, the wave functions become more asymmetrical about the center of the well than when Ee=0 or Ee=−Ei. Simultaneously, the excitonic transition peak in the quantum well structure causes a red shift. As a result, as shown in FIG. 10, λmin unilaterally increases with an increase in the magnitude (|Ee|) of the bias electric field. The consequent operation characteristics of the optical filter are analogous to those of optical devices with conventional quantum well structures having no internal electric field.

On the other hand, when a reverse bias electric field Ee (|Ee|≦|Ei|) lower than Ei is applied to the strained quantum well structure of this example, as shown in FIG. 7A, the wave functions become more symmetrical about the center of the well than when Ee=0. At the same time, the excitonic transition peak in the quantum well structure causes a blue shift. As shown in FIG. 10, therefore, λmin decreases as the magnitude (|Ee|) of the bias electric field increases.

That is, in the optical filter incorporating the strained quantum well structure in the [111] direction proposed in this example, it is possible to freely control a wavelength range to be selected by the magnitude and the direction of an external bias electric field. In contrast, conventional devices have drawbacks that this selection depends only on the magnitude of the bias electric field and λmin increases unilaterally with an increase in the bias electric field.

Example 7

Example 7 exemplifies an advanced light intensity modulator which can efficiently modulate the incident light intensity over a broad wavelength range in accordance with not only the magnitude but the direction of an applied electric field.

Figure 11:
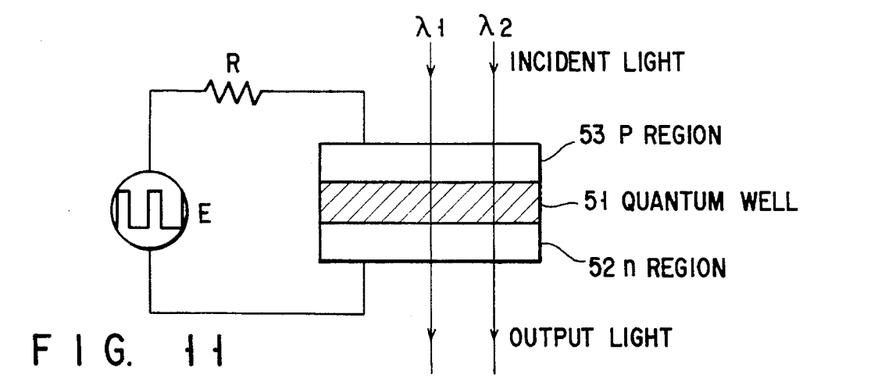
FIG. 11 is a view showing the structure of a light intensity modulator according to Example 7.

FIG. 11 shows the arrangement of a light intensity modulator according to Example 7, which includes one of the strained quantum wells shown in FIGS. 2 to 4. More specifically, this structure is formed by forming an n-type cladding layer (n-type region) 52 on an n-type GaAs substrate, a strained quantum well structure 51 on top of the layer 52, and a p-type cladding layer (p-type region) 53 on top of the quantum well structure 51. A power source is connected between the n- and p-type regions 52 and 53 via a load resistor R.

As described above, the three types of strained quantum well structures shown in FIGS. 2 to 4 are different from one another in the mechanism of a strain or the characteristic wavelengths of light absorption caused by excitonic transition, but an internal electric field that can be controlled independently of a band offset exists in the quantum well layer in any of these three strained quantum well structures. Although an internal electric field also occurs in the barrier layer when the barrier layer is strained as well as the well layer, this internal electric field localized in the barrier layer has almost no influence on the electrical and optical characteristics of the quantum well structure. Therefore, focusing attention only on an internal electric field (to be referred to as Ei hereinafter) present in the quantum well layer, the operating principle of the optical device proposed by the present invention will be described below.

Figure 12:
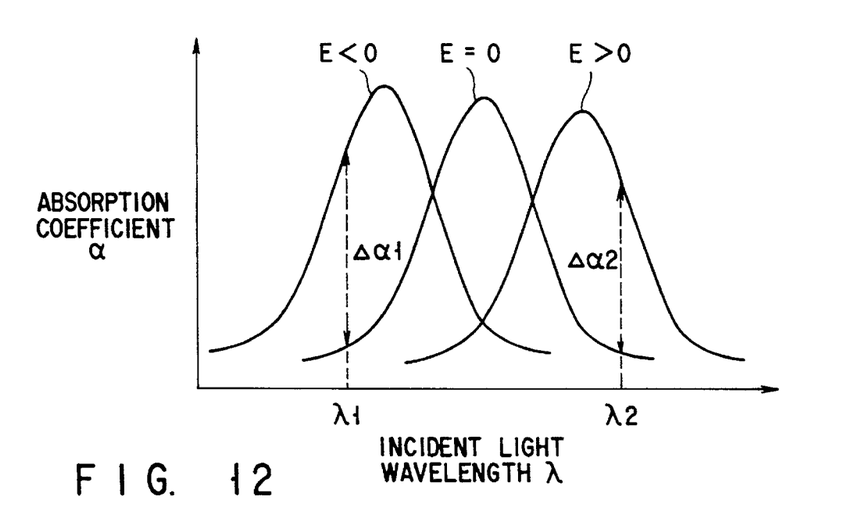
FIG. 12 is a graph showing the operating principle of the light intensity modulator according to Example 7.

FIG. 12 is a graph for explaining the operating principle of the light intensity modulator according to Example 7. The internal electric field (Ei) resulting from the strain confined effect is present in the well layer, so if an external electric field (reverse bias) in a direction opposite to Ei is applied to the quantum well structure (E<0 in FIG. 12), the absorption peak in excitonic transition shifts to the short-wavelength side (blue shift), and at the same time an absorption coefficient α also slightly increases. On the other hand, if an external electric field (forward bias) in the same direction as that of Ei is applied to the quantum well structure (E>0 in FIG. 12), the absorption peak in excitonic transition shifts to the long-wavelength side (red shift), and simultaneously the absorption coefficient α decreases. Therefore, very large changes Δα1 and Δα2 in absorption coefficient can be obtained for both incident light components with wavelengths λ1 and λ2 (λ2>λ1) by properly selecting the magnitude and the direction of the applied electric field.

Figure 13:
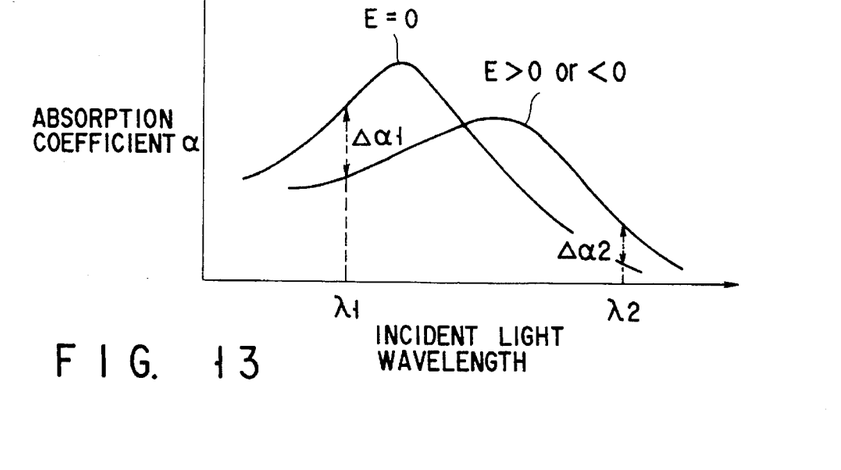
FIG. 13 is a graph showing the operating principle of a conventional light intensity modulator.

In contrast to this, as shown in FIG. 13, no internal electric field is present in a well layer of a light intensity modulator incorporating a conventional GaAs/AlGaAs quantum well structure, so even if an external electric field is applied in any direction to the quantum well structure (E>0 or E<0 in FIG. 13), the absorption peak in excitonic transition unilaterally shifts to the long-wavelength side (red shift), and at the same time the absorption coefficient unilaterally decreases. As a result, both the changes Δα1 and Δα2 in absorption coefficient caused by the applied electric field are much smaller than those obtained by the light intensity modulator of this example for both the incident light components with the wavelengths λ1 and λ2.

Figure 14:
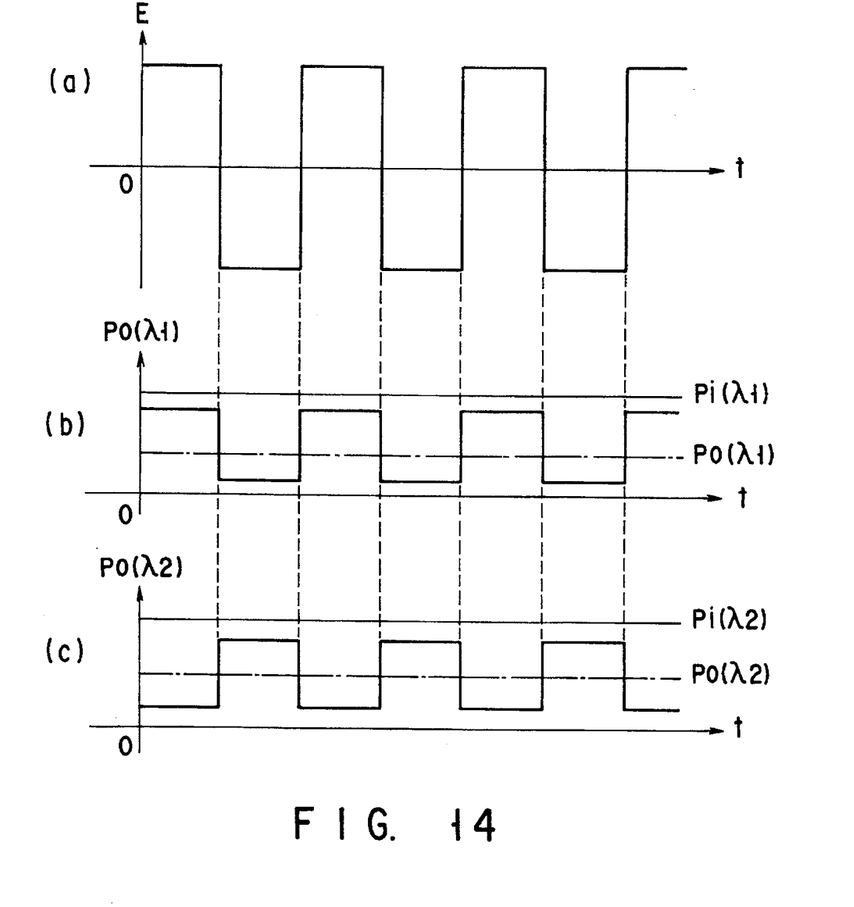
FIG. 14 is a timing chart showing the modulating characteristics obtained when the light intensity modulator of Example 7 is applied as an optical filter with a very high wavelength selectivity.

FIG. 14 shows the modulating characteristics obtained when the light intensity modulator of Example 7 is applied as an optical filter with a very high wavelength selectivity. As can be seen from FIG. 14, output optical powers Po(λ1) and Po(λ2) are modulated to behave in exactly opposite manners by a rectangular external electric field E with respect to incident light components having wavelengths λ1 and λ2 and input powers Pi(λ1) and Pi(λ2), respectively. That is, when the external electric field E is positive (E>0), almost only the incident light of λ1 is output. When E is negative (E<0), on the other hand, almost only the incident light of λ2 is output. Since the positive and negative external electric fields E are alternately applied, the incident light components with the wavelengths λ1 and λ2 are also alternately output (selected).

Note that for the purpose of comparison, output powers Po'(λ1) and Po'(λ2) obtained in a conventional quantum well structure under the same conditions are indicated by alternate long and short dashed lines in FIG. 14. It is apparent from FIG. 14 that both the Po'(λ1) and Po'(λ2) hardly depend on time regardless of changes in E and hence have no selectivity.

Example 8

Example 8 exemplifies a novel quantum well optical waveguide characterized in that a very large refractive index change (which is several times larger than those obtained by conventional structures) can be obtained by applying an external electric field twice as high as an internal electric field in a direction opposite to that of the internal electric field.

Figure 15:
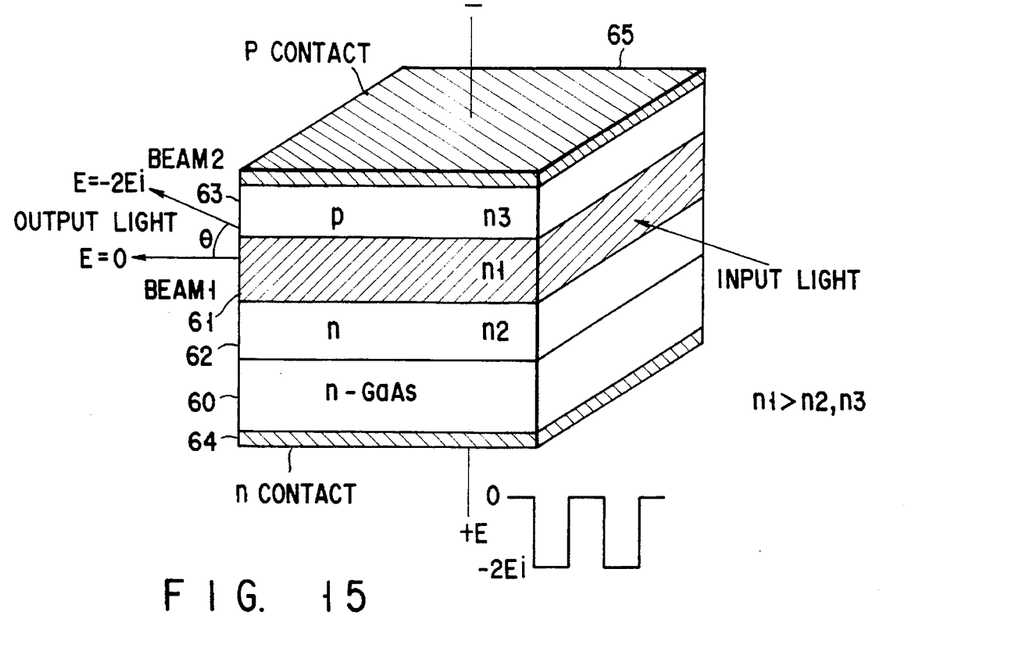
FIG. 15 is a perspective view showing the structure of an optical waveguide according to Example 8.

FIG. 15 shows the core portion of an optical waveguide which includes one of the strained quantum well structures shown in FIGS. 2 to 4 and can deflect a light beam by using an applied electric field. More specifically, a cladding layer 62 with a refractive index n2 is grown on an n-type GaAs substrate 60, a strained quantum well structure 61 with a refractive index n1 is formed on top of the layer 62, and a p-type cladding layer 63 with a refractive index n3 is formed on top of the quantum well structure 61, thereby forming a layered structure (n1>n2, n3). An external power source is connected to the upper and lower end faces of this waveguide via electrodes 64 and 65.

When an electric field is applied to the waveguide (quantum well structure), a light absorption peak wavelength is shifted by excitonic transition. Therefore, an absorption coefficient in the quantum well changes with respect to input light with a certain wavelength. Since the relationship between the absorption coefficient and the refractive index is defined by the Kramers-Kronig relation, it is obvious that the refractive index of the quantum well is modulated by an applied electric field. Generally, a change Δn in the refractive index has a relation of $\Delta n = kE^2/\Delta^2$ (where k is the proportional constant) with an applied electric field E and an energy shift Δ.

Figure 16A:
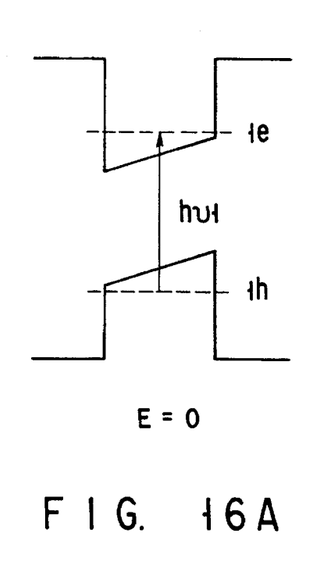
FIGS. 16A to 16C are views each showing the band structure of a strained quantum well in Example 8.
Figure 16B:
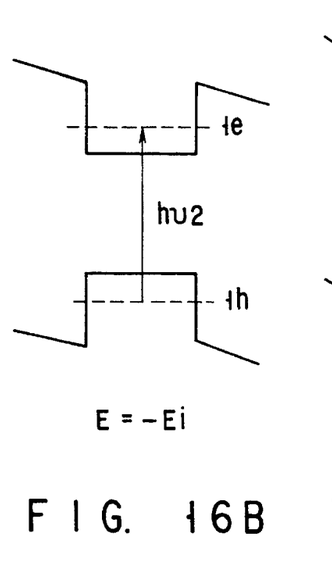
Figure 16C:
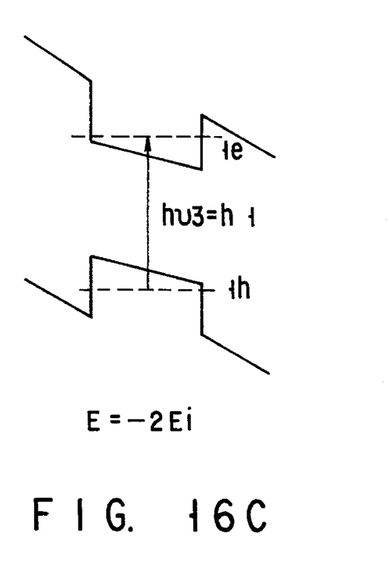

In conventional GaAs/AlGaAs quantum well structures, the absolute value of $\Delta$ increases with an increase in the absolute value of E (regardless of the direction), and so no large change ($\Delta n$) in refractive index can be expected. In contrast to this, in the optical waveguide including the strained quantum well structure with an internal electric field Ei according to the present invention, as shown in FIG. 16, the shift $\Delta$ of a light absorption peak does not necessarily, unilaterally increase as the applied electric field increases. Especially when an external electric field twice as high as the internal electric field is applied to the quantum well structure in a direction opposite to that of the internal electric field (E=–2Ei), energy hv3 of the light absorption peak equals energy hv1 of the light absorption peak when no electric field is applied (E=0). That is, it is considered that the change $\Delta n$ in refractive index is extremely large (there is a possibility that the change reaches values several times or more larger than those of regular changes) as a result of $\Delta h = hv3 - hv1 = 0$.

By using this entirely new characteristic, the optical waveguide of Example 8 can be applied to a high-speed, large-angle light beam deflector (see FIG. 15). When the rectangular external electric field E is applied to the optical waveguide, a beam 1 and a beam 2 are obtained as output light beams for E=0 and E=–2Ei, respectively, so the output light beams are deflected at a high speed by the rectangular external electric field E. Note that since a difference $\Delta n$ between refractive indexes when E=0 and E=–2Ei is extremely large, an angle (angle of deflection) $\theta$ defined by the beams 1 and 2 also becomes very large, and a large-angle light beam deflector can be obtained.

Example 9

Example 9 exemplifies an optical switch with a high extinction ratio, a high stability, and a variable operating wavelength.

In conventional optical bistable devices (optical switches) represented by a SEED, not only the extinction ratio is low but the range of an applied electric field required for an operation is narrow, resulting in a low stability and limited light wavelengths to be switched. In contrast to this, when any of the strained quantum well structures formed in the [111] direction shown in FIGS. 2 to 4 is used in place of the conventional quantum well structures, it is possible to realize an optical switching device in which both the extinction ratio and stability are high and the range of operating wavelengths is variable. The arrangement of this device is identical with that shown in FIG. 11, and the operating principle of the device is as follows.

Assume that the characteristic wavelength of excitonic transition in the strained quantum well when no electric field is applied (E=0) is $\lambda 0$ and the internal electric field present in the strained quantum well is Ei. An absorption coefficient $\alpha$ in the strained quantum well and an applied electric field E have the relationships as shown in FIGS. 17A, 17B, and 17C with respect to incident light components with wavelengths $\lambda$, which satisfy $\lambda < \lambda 0$, $\lambda = \lambda 0$, and $\lambda > \lambda 0$, respectively.

Figure 17A:
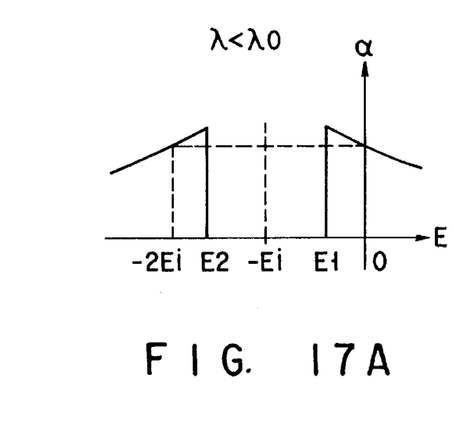
FIGS. 17A to 17C are views each showing the dependencies of an absorption coefficient on an applied electric field and an incident light wavelength in an optical switching device according to Example 9.

First, in the case of $\lambda < \lambda 0$ shown in FIG. 17A, the energy of incident photons is higher than the characteristic transition energy in the strained quantum well when E=0. Therefore, light absorption still takes place even if an electric field with a certain value or less ($|E| \leq |E1|$) is applied in a direction opposite to that of Ei. If, however, this reverse bias electric field is increased to reach a range of $|E1| < |E| < |E2|$, the energy of incident photons eventually becomes lower than the characteristic transition energy of the quantum well, and this consequently disables light absorption ($\alpha=0$). That is, the incident light immediately passes through the quantum well. Since, however, the characteristic transition energy in the quantum well starts decreasing from its peak value at the time reverse bias electric field E=–Ei, light absorption occurs again from a certain point ($|E| \geq |E2|$). E1 and E2, and E3 and E4 at this time shown in FIG. 17C are completely determined by the wavelength $\lambda$ of incident light and hence have no relationship with the strained quantum well structure itself.

Figure 17B:
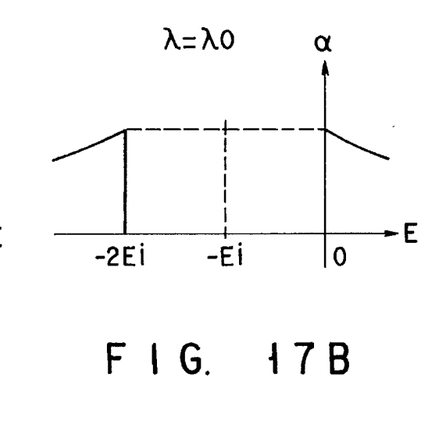
Figure 17C:
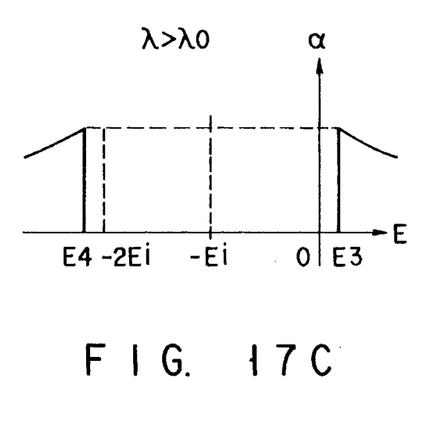

By giving exactly the same consideration as described above to the cases of $\lambda = \lambda 0$ and $\lambda > \lambda 0$, it can be understood that the absorption coefficient $\alpha$ and the applied electric field E have the relationships as shown in FIGS. 17B and 17C, respectively. As is apparent from FIGS. 17A to 17C, in the optical device of this example, since an electric field in which no light absorption takes place exists regardless of the wavelength of incident light, the change in absorption coefficient, i.e., the extinction ratio is very high. In addition, a region (called a stable operation enable region) in which the absorption coefficient $\alpha$ remains unchanged even if a slight fluctuation occurs in an applied electric field strongly depends on the wavelength of incident light. By appropriately selecting the internal electric field Ei in the quantum well, however, a necessary stable operation region can be assured for incident light with any wavelength. This is the characteristic feature that is not possible unless the strained quantum well structure of the present invention is used. That is, the light wavelength to be switched is variable in the optical switching device of Example 9.

Example 10

Example 10 illustrates a photodiode having a high peak/valley ratio with positive and negative resistances.

Figure 18A:
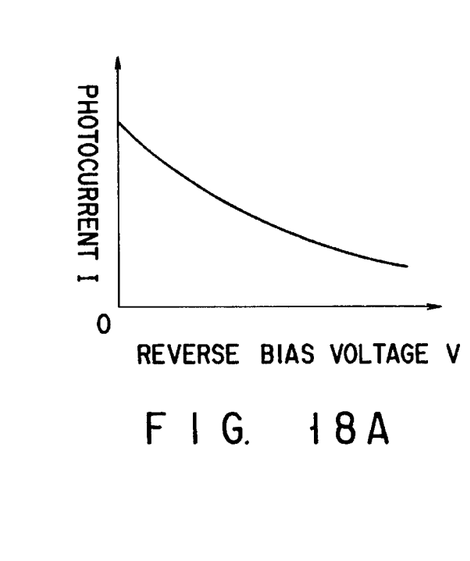
FIGS. 18A and 18B are graphs each showing the photocurrent—reverse bias voltage characteristic of a photodiode according to Example 10.

Still another application of the strained quantum well structure formed in the [111] direction proposed by the present invention is a photodiode having a high peak/valley (photocurrent) ratio with positive and negative resistances with respect to an external bias voltage. Although the negative resistance appears in a device such as a SEED, since a photocurrent I unilaterally decreases as a bias voltage V increases, as shown in FIG. 18A, neither a positive resistance nor a peak and a valley appear. Conversely, in a photodiode using any of the strained quantum well structures shown in FIGS. 2 to 4, both positive and negative resistances exist, and the peak/valley ratio of a photocurrent is very high. The arrangement of such a photodiode is the same as that of a conventional photodiode except for a portion of a quantum well structure, and the operating principle of the photodiode is as follows.

Figure 18B:
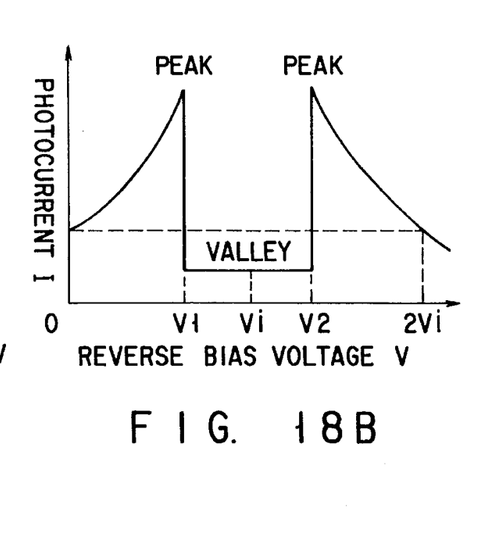

Suppose that the characteristic wavelength of light absorption due to excitonic transition when a reverse bias electric field E is exactly equal to an internal electric field Ei in the strained quantum well (E=–Ei) is $\lambda 0$. Suppose also that $\lambda 0$, i.e., Ei is already adjusted such that a wavelength $\lambda$ of light incident on the photodiode is longer than $\lambda 0$ at any instant. It is understood from the consideration of light absorption that the resulting photocurrent—reverse bias current characteristic of the photodiode is as shown in FIG. 18B. Referring to FIG. 18B, Vi=EiLz, Lz is the width of the well, and V1 and V2 are determined by the wavelength of incident light.

As is apparent from FIG. 18B, the photodiode exhibits a positive resistance in a region of V<V1 but exhibits a negative resistance in a region of V>V2. In a region of $V1 \leq V \leq V2$, a photocurrent is extremely small because no light absorption occurs. As a result, a very high peak/valley (photocurrent) ratio can be obtained when $V=V1, V2$. That is, the photocurrent can be controlled by the reverse bias voltage with respect to incident light with a certain wavelength. This enables the photodiode of Example 10 to essentially function as a highly efficient switch.

Note that the present invention is not limited to the above examples but can be practiced in the form of various modifications without departing from the spirit and scope of the invention. As an example, the present invention is applicable to a superlattice which is a structure obtained by periodically stacking two or more types of different crystal layers.

According to the present invention as has been described above, the internal electric field and the band offset in a strained quantum well structure can be controlled independently of each other as needed. This makes it possible to realize a semiconductor quantum well optical device with a stained quantum well structure which has as large an optical bistable effect as possible while maintaining the blue-shift light absorption characteristic.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An optical device having a quantum well structure, the optical device comprising:

a semiconductor substrate;

a plurality of barrier layers formed on said semiconductor substrate; and a quantum well layer having a band gap energy and a lattice constant which differ from those of said barrier layers, said quantum well layer being formed between two adjacent barrier layers; and wherein each of said plurality of barrier layers has a thickness larger than a critical film thickness for barrier layers, and wherein an energy band offset and an internal electric field in the quantum well layer are set to a predetermined value by a composition and thickness of the barrier layer, respectively.

2. The optical device of claim 1, wherein:

when the lattice constant and the energy band gap of the quantum well layer are a(A) and Eg(A), respectively; and the lattice constant and the energy band gap of the barrier layer are a(B) and Eg(B), respectively; and the lattice constant and the energy band gap of the semiconductor substrate are a(C) and Eg(C), respectively;

then a(A)>a(B), Eg(A)<Eg(B), a(B)<a(C), and Eg(B)>Eg(C) are satisfied, whereby a tensile strain is produced in said barrier layer.

3. The optical device of claim 2, wherein a compression strain is produced in said quantum well layer by partial relaxation of the tensile strain in said barrier layers.

4. The optical device according to claim 3, wherein the relaxation of the tensile strain is not more than 8% of a strain confined in said barrier layers.

5. The optical device of claim 1, wherein said semiconductor substrate is made of a zinc-blend type compound semiconductor.

6. The optical device of claim 1, wherein said semiconductor substrate has a (111) surface.

7. The optical device of claim 1, wherein said quantum well layer is a zinc-blend type compound semiconductor.

8. The optical device of claim 1, wherein each of said plurality of barrier layers are zinc-blend type compound semiconductors.

9. The optical device of claim 1, wherein the thickness of each of said plurality of barrier layers is two to four times as large as said critical film thickness for said barrier layers.

10. The optical device according to claim 1, comprising a plurality of said quantum well layers, said quantum well layers and said barrier layers being alternately laminated one upon the other on said substrate.

11. The optical device according to claim 1, further comprising:

an n-type compound semiconductor layer formed between said semiconductor substrate and said barrier layers; and a p-type compound semiconductor layer formed on a barrier layer which is formed on said quantum well layer so that the barrier layers and the quantum well layer are sandwiched between the n-type compound semiconductor layer and the p-type compound semiconductor layer.

12. An optical device having a quantum well structure comprising:

a semiconductor substrate made of GaAs, said semiconductor substrate having a (111) surface;

a plurality of barrier layers formed on the (111) surface of said semiconductor substrate, said plurality of barrier layers each being made of AlGaAs; and a quantum well layer made of GaAsP, said quantum well layer being formed between two adjacent barrier layers; and wherein an energy band offset and an internal electric field in the quantum well layer is controlled by the composition of Al and P, respectively.

13. The optical device according to claim 12, further comprising:

an n-type compound semiconductor layer formed between said semiconductor substrate and said barrier layer; and a p-type compound semiconductor layer formed on the barrier layer which is formed on said quantum well layer so that the barrier layers and the quantum well layer are sandwiched between the n-type compound semiconductor layer and the p-type compound semiconductor layer.

14. An optical device having a quantum well structure, the optical device comprising:

a semiconductor substrate made of GaAs, said semiconductor substrate having a (111) surface;

a plurality of barrier layers formed on the (111) surface of said semiconductor substrate, said plurality of barrier layers each being made of InAlAs; and a quantum well layer made of InGaAs, said quantum well layer being formed between two adjacent barrier layers; and wherein the composition of In in the InGaAs is set such that a predetermined internal electric field is produced in the quantum well layer, and the composition of Al in the InAlAs is set so that a predetermined energy band offset is produced in the quantum well layer under said predetermined internal electric field.

15. The optical device according to claim 14, further comprising:
- an n-type compound semiconductor layer formed between said semiconductor substrate and said barrier layer; and
- a p-type compound semiconductor layer formed on the barrier layer which is formed on said quantum well layer so that the barrier layers and the quantum well layer are sandwiched between the n-type compound semiconductor layer and the p-type compound semiconductor layer.

16. The optical device according to claim 14, comprising a plurality of said quantum well layers each of which is made of InGaAs, said quantum well layers and said barrier layers being alternately laminated one upon the other on said semiconductor substrate.

* * * * *